(12) United States Patent
Cheng

(10) Patent No.: US 11,152,213 B2
(45) Date of Patent: Oct. 19, 2021

(54) TRANSISTOR DEVICE WITH ULTRA LOW-K SELF ALIGNED CONTACT CAP AND ULTRA LOW-K SPACER

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/289,893

(22) Filed: Mar. 1, 2019

(65) Prior Publication Data

US 2020/0279745 A1 Sep. 3, 2020

(51) Int. Cl.
| | |
|---|---|
| *H01L 21/28* | (2006.01) |
| *H01L 29/66* | (2006.01) |
| *H01L 21/768* | (2006.01) |
| *H01L 23/522* | (2006.01) |
| *H01L 29/417* | (2006.01) |
| *H01L 21/3213* | (2006.01) |

(52) U.S. Cl.
CPC .. *H01L 21/28123* (2013.01); *H01L 21/28247* (2013.01); *H01L 21/76802* (2013.01); *H01L 23/5226* (2013.01); *H01L 29/41775* (2013.01); *H01L 29/6653* (2013.01); *H01L 29/6656* (2013.01); *H01L 29/66568* (2013.01); *H01L 29/66795* (2013.01); *H01L 21/32134* (2013.01); *H01L 21/32137* (2013.01)

(58) Field of Classification Search
CPC ............... H01L 21/28123; H01L 21/28247
See application file for complete search history.

(56) References Cited

U.S. PATENT DOCUMENTS

| | | | |
|---|---|---|---|
| 9,214,392 B1* | 12/2015 | Lu | ............... H01L 21/76832 |
| 9,704,746 B1 | 7/2017 | Shu et al. | |
| 9,780,194 B1 | 10/2017 | Balakrishnan et al. | |
| 9,842,801 B2 | 12/2017 | Wei et al. | |
| 9,985,107 B2 | 5/2018 | Cheng et al. | |
| 2010/0330794 A1* | 12/2010 | Kurisu | ............. H01L 21/28518 |
| | | | 438/592 |
| 2014/0357042 A1* | 12/2014 | Richter | ............... H01L 29/6656 |
| | | | 438/302 |

(Continued)

*Primary Examiner* — Trang Q Tran
(74) *Attorney, Agent, or Firm* — Tutunjian & Bitetto, P.C.; L. Jeffrey Kelly

(57) ABSTRACT

A method of forming a field effect transistor device is provided. The method includes forming a gate stack on a substrate, and forming a sidewall spacer on the gate stack. The method further includes forming a protective liner on the sidewall spacer, and forming a sacrificial gate cap on the gate stack. The method further includes forming a first dielectric fill layer on the protective liner, and forming a second dielectric fill layer on the first dielectric fill layer. The method further includes forming an opening in the second dielectric fill layer and the first dielectric fill layer that exposes the protective liner and sacrificial gate cap. The method further includes removing the sacrificial gate cap to form a cavity between the gate stack and the second dielectric fill layer, and removing the exposed sacrificial liner.

10 Claims, 10 Drawing Sheets

(56) References Cited

U.S. PATENT DOCUMENTS

2015/0255556 A1* 9/2015 Cheng ................ H01L 29/7813
257/332
2017/0352591 A1 12/2017 Zhang et al.

* cited by examiner

TRANSISTOR DEVICE WITH ULTRA LOW-K SELF ALIGNED CONTACT CAP AND ULTRA LOW-K SPACER

BACKGROUND

The present invention generally relates to field effect transistor (FET) devices, and more particularly to FET gate structures with spacers.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a field effect transistor device is provided. The method includes forming a gate stack on a substrate, and forming a sidewall spacer on the gate stack. The method further includes forming a protective liner on the sidewall spacer, and forming a sacrificial gate cap on the gate stack. The method further includes forming a first dielectric fill layer on the protective liner, and forming a second dielectric fill layer on the first dielectric fill layer. The method further includes forming an opening in the second dielectric fill layer and the first dielectric fill layer that exposes the protective liner and sacrificial gate cap. The method further includes removing the sacrificial gate cap to form a cavity between the gate stack and the second dielectric fill layer, and removing the exposed sacrificial liner.

In accordance with another embodiment of the present invention, a method of forming a fin field effect transistor device is provided. The method includes forming a gate structure on a vertical fin on a substrate, and forming a sidewall spacer on the gate structure. The method further includes forming a protective liner on the sidewall spacer, and forming a sacrificial gate cap on the gate structure. The method further includes forming a first dielectric fill layer on the protective liner, and forming a second dielectric fill layer on the first dielectric fill layer. The method further includes forming an opening in the second dielectric fill layer and the first dielectric fill layer that exposes the protective liner and sacrificial gate cap. The method further includes removing the sacrificial gate cap to form a cavity between the gate structure and the second dielectric fill layer, and removing the exposed sacrificial liner.

In accordance with yet another embodiment of the present invention, a field effect transistor device is provided. The field effect transistor device includes a gate stack on a substrate, and a source/drain on the substrate. The field effect transistor device further includes a lower sidewall spacer segment adjoining a lower portion of the gate stack, and a combination gate cap spacer on the gate stack, source/drain, and lower sidewall spacer segment. The field effect transistor device further includes a protective liner on the lower sidewall spacer segment and a portion of the combination gate cap spacer, and a first dielectric fill layer on a side of the protective liner opposite from the combination gate cap spacer. The field effect transistor device further includes a second dielectric fill layer on another portion of the combination gate cap spacer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

Figure 12:
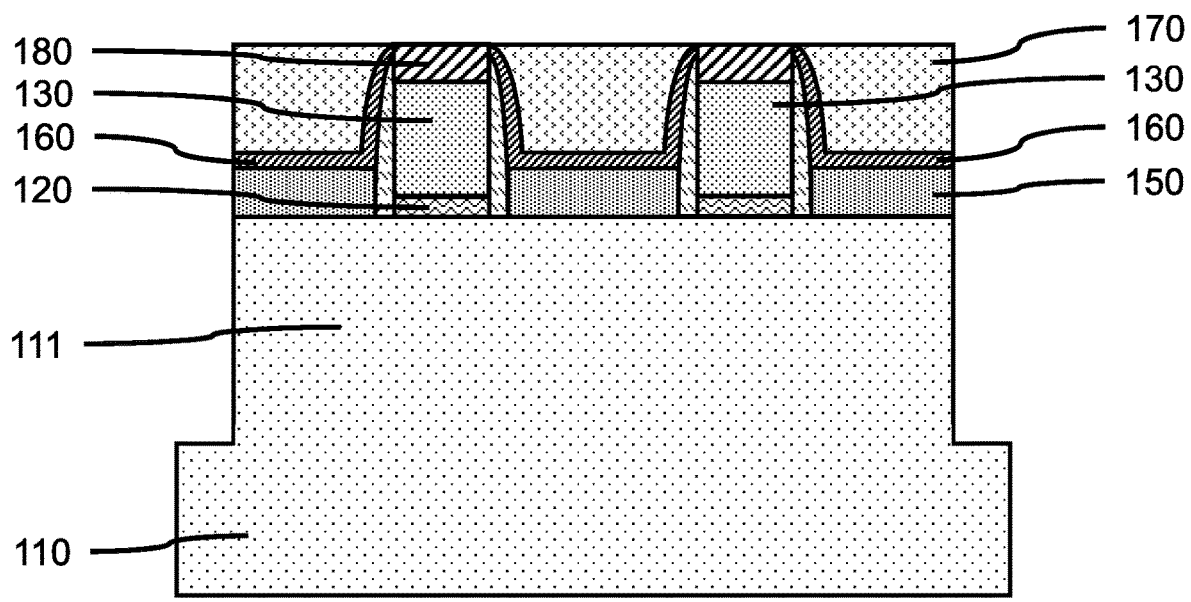
Figure 13:
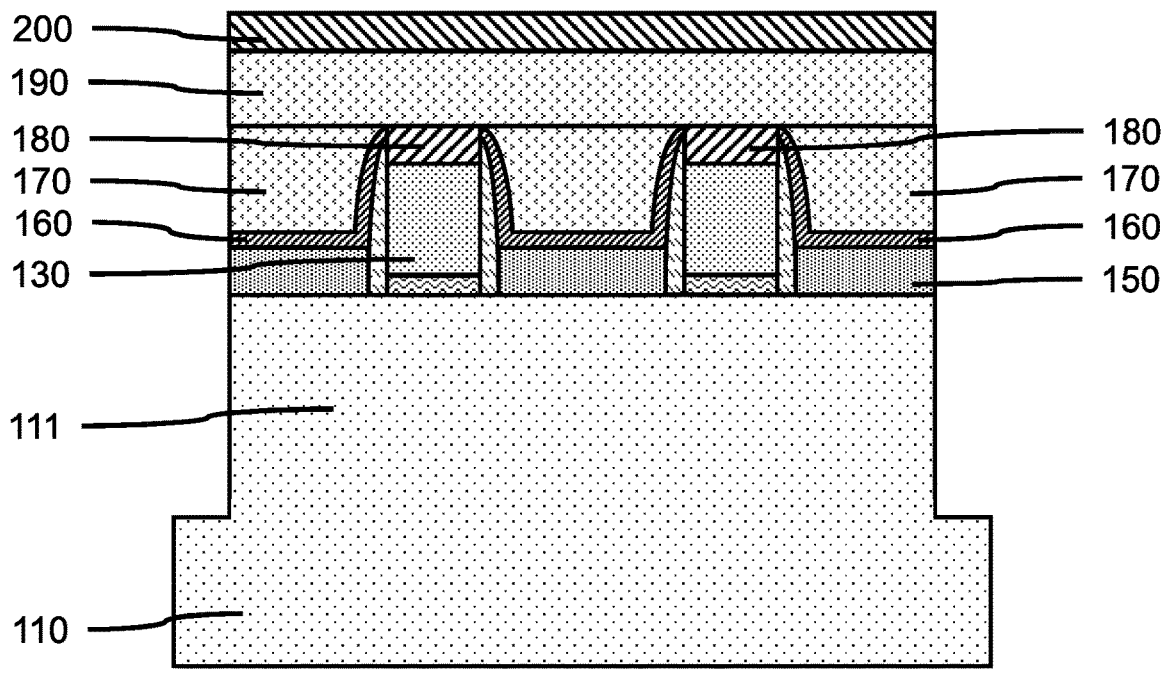
Figure 14:
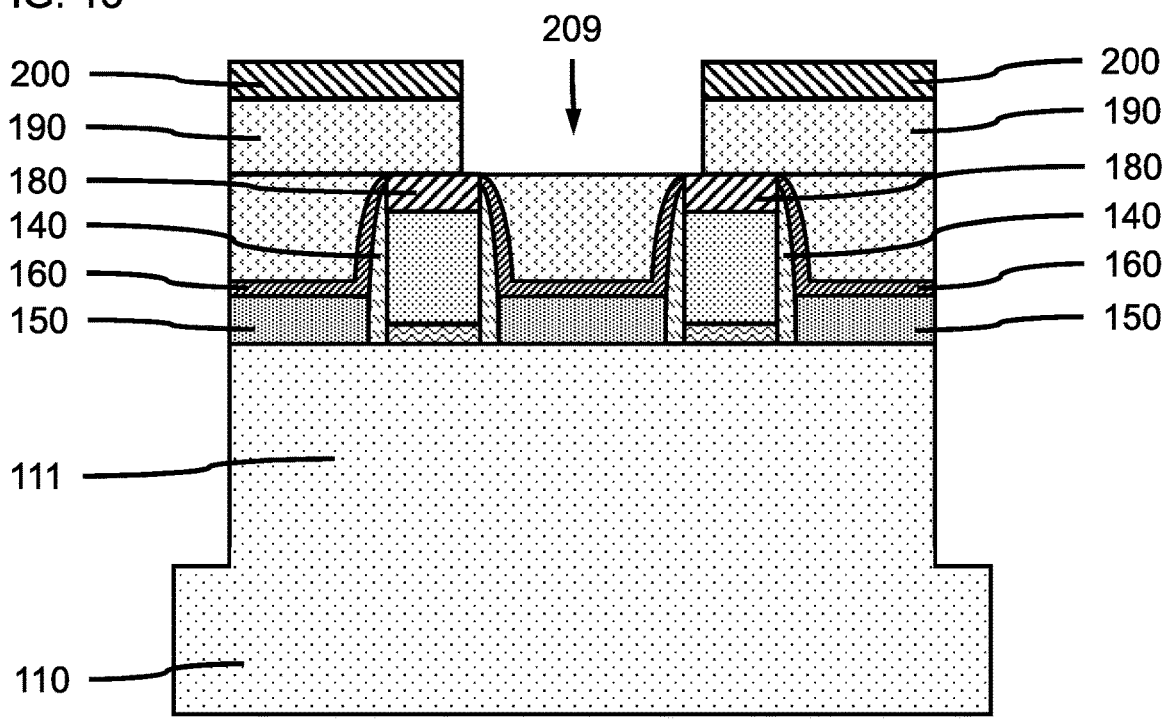
Figure 15:
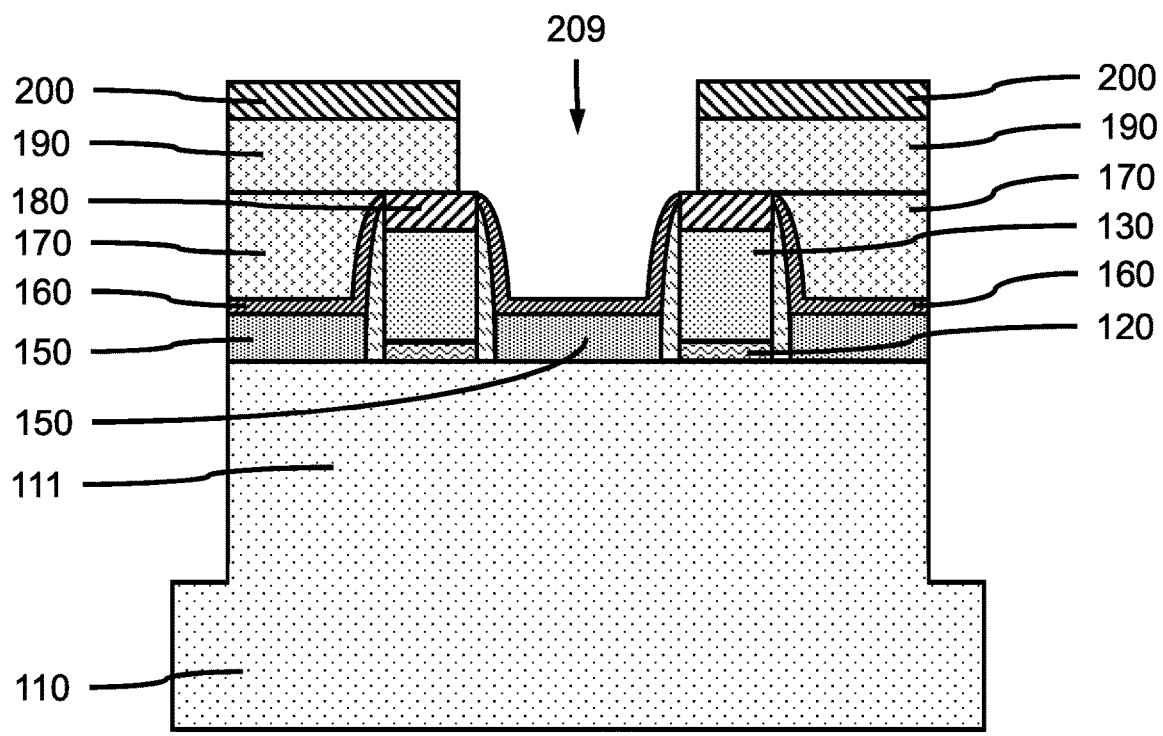
Figure 16:
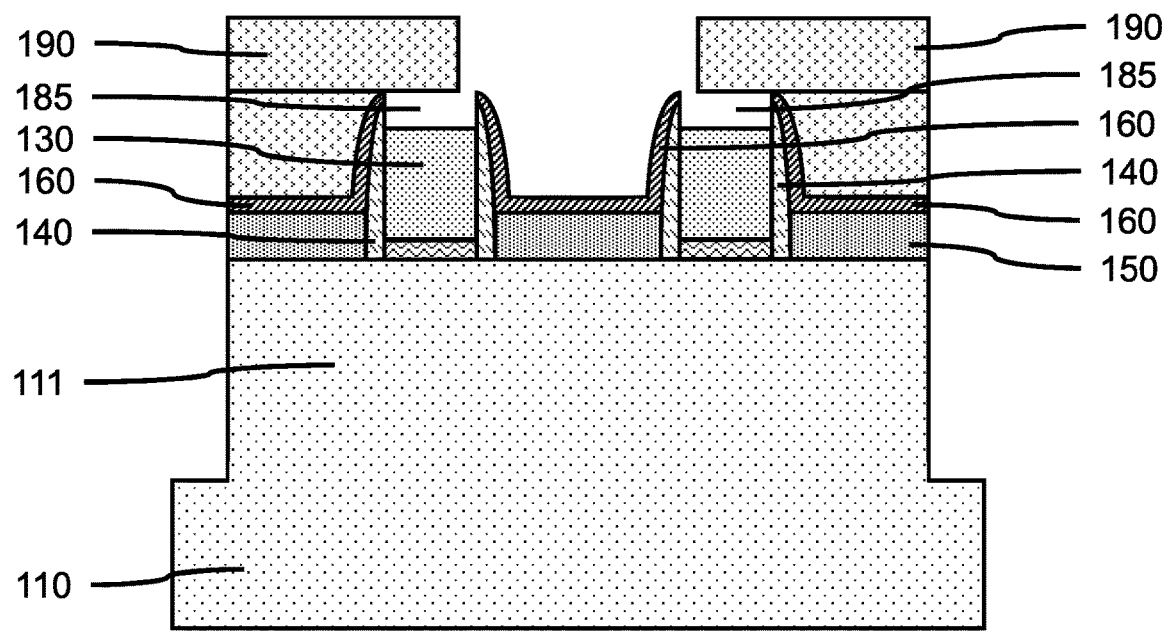
Figure 17:
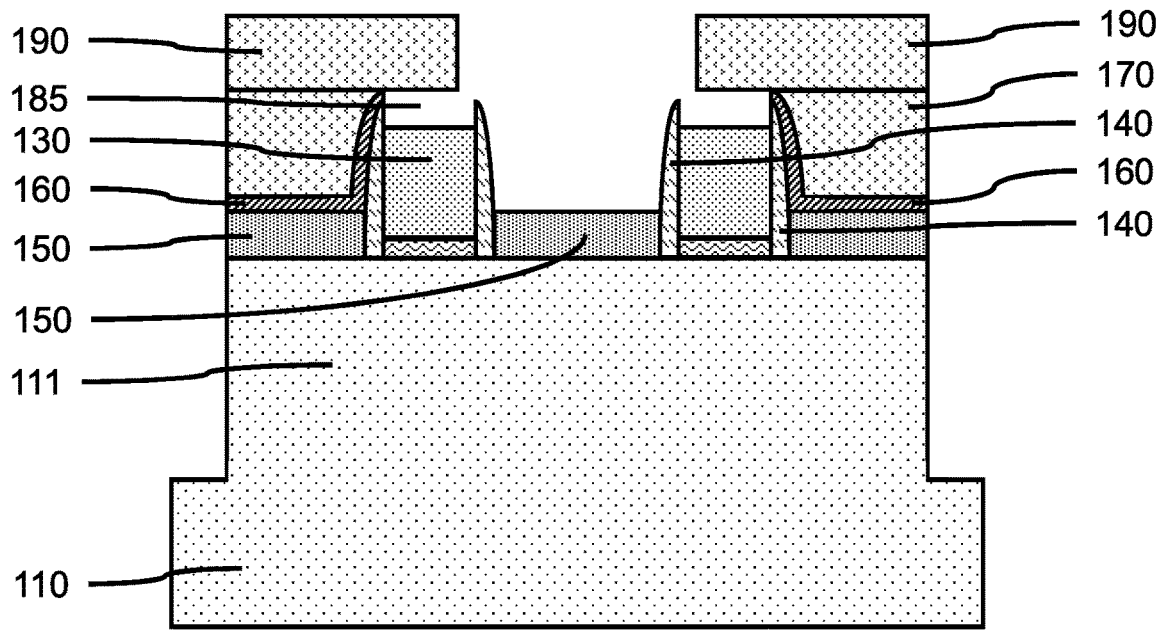
Figure 18:
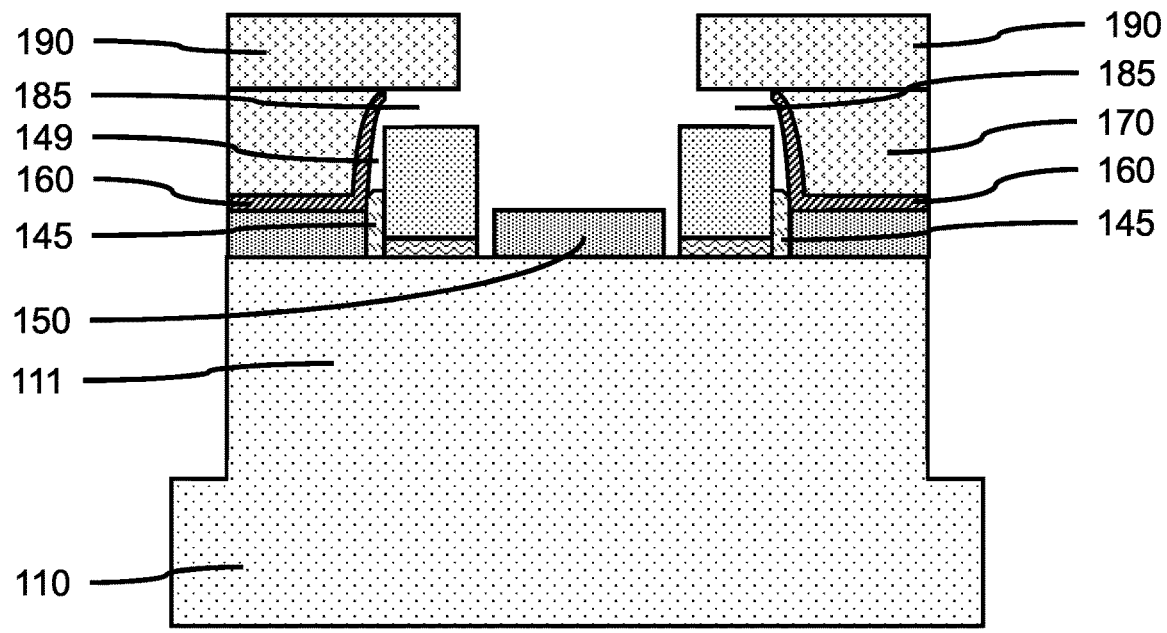
Figure 19:
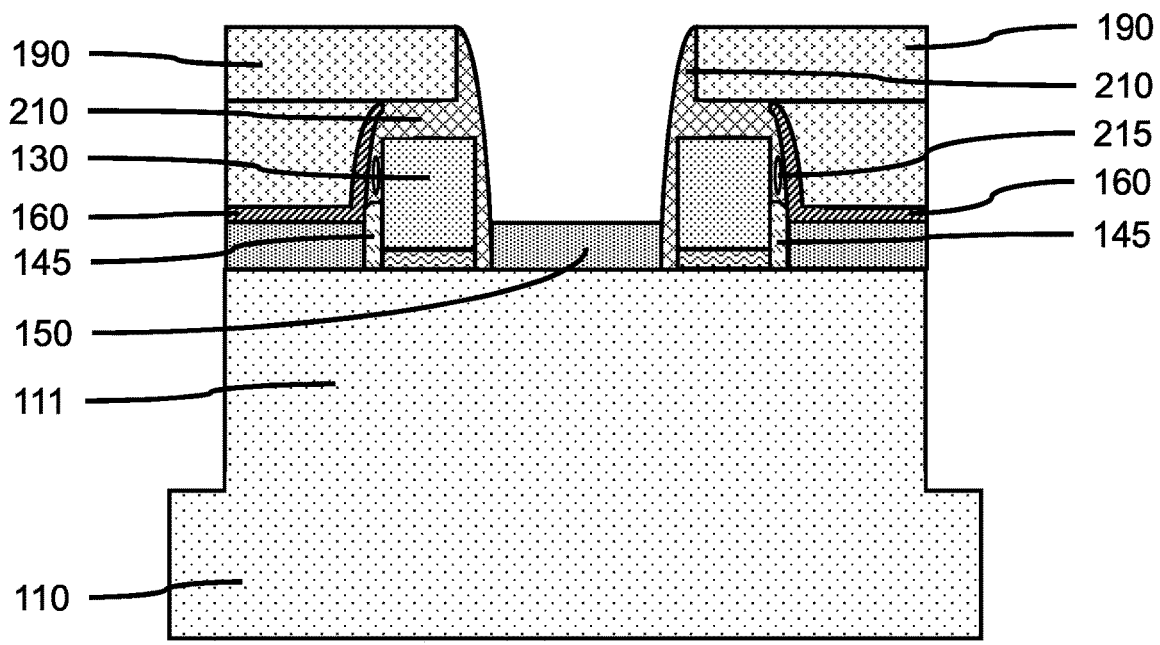
Figure 20:
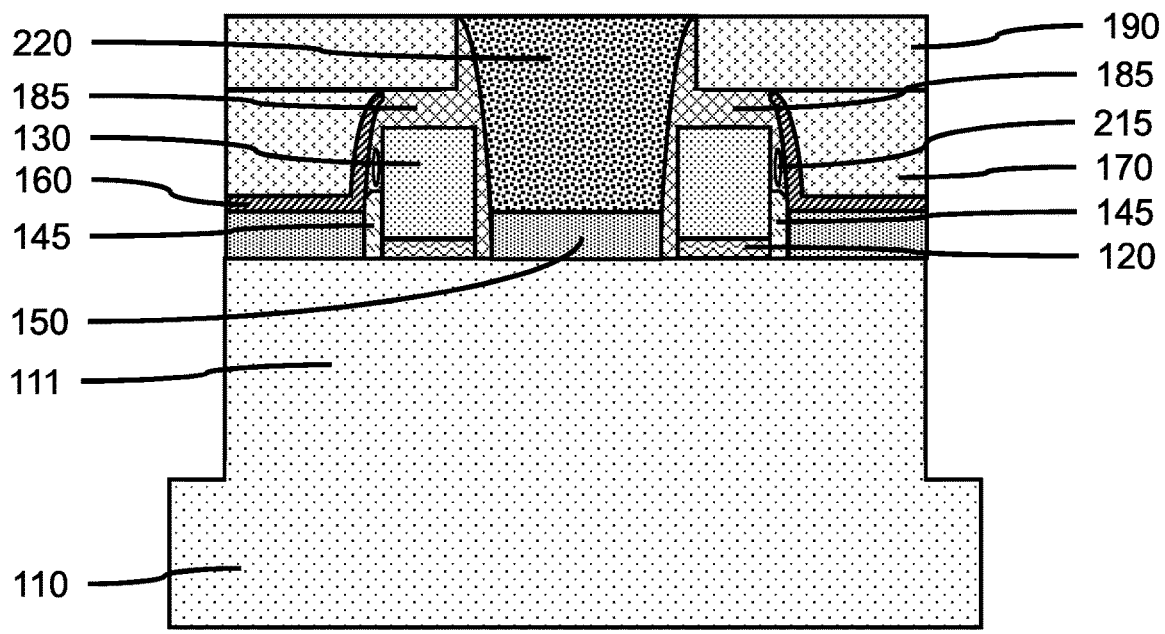

device, each gate structure including, a gate dielectric layer and a gate electrode, in accordance with an embodiment of the present invention;

FIG. 12 is a cross-sectional side view showing a plurality of source/drains on a vertical fin, a sidewall spacer on each of the gate structures, and a sacrificial gate cap on the gate electrode, in accordance with an embodiment of the present invention;

FIG. 13 is a cross-sectional side view showing a first dielectric fill layer on the protective liner, a second dielectric fill layer on the first dielectric fill layer and sacrificial gate caps, and a masking layer on the second dielectric fill layer, in accordance with an embodiment of the present invention;

FIG. 14 is a cross-sectional side view showing an opening formed through the masking layer and second dielectric fill layer, that exposes a portion of the sacrificial gate caps and first dielectric fill layer, in accordance with an embodiment of the present invention;

FIG. 15 is a cross-sectional side view showing removal of the exposed portion of the first dielectric fill layer to expose a portion of the protective liner, in accordance with an embodiment of the present invention;

FIG. 16 is a cross-sectional side view showing removal of the sacrificial gate caps that exposes the gate electrode and portions of the sidewall spacers, in accordance with an embodiment of the present invention;

FIG. 17 is a cross-sectional side view showing removal of the protective liner exposed by removing the portion of the first dielectric fill layer, in accordance with an embodiment of the present invention;

FIG. 18 is a cross-sectional side view showing removal of the sidewall spacers exposed by removal of the protective liner and a portion of the sidewall spacers between the gate electrode and opposite protective liner, in accordance with an embodiment of the present invention;

FIG. 19 is a cross-sectional side view showing formation of a combination gate cap spacer with an air gap on the gate electrode, in accordance with an embodiment of the present invention; and FIG. 20 is a cross-sectional side view showing formation of a source/drain contact between facing combination gate cap spacers, in accordance with an embodiment of the present invention.

DETAILED DESCRIPTION

Embodiments of the present invention provide a field effect transistor (FET) device having reduced parasitic capacitances by forming an ultra-low-k spacer between a gate stack or gate structure of the FET and an adjacent source/drain contact. Replacement of higher-k materials used for initial spacers and layers with the ultra-low-k spacer after high temperature fabrication processes can reduce the parasitic capacitances while avoiding degradation of the ultra-low-k material due to the high temperature processing.

Embodiments of the present invention provide a method of fabricating a field effect transistor (FET) device or fin field effect transistor (FinFET) device having an ultra-low-k spacer that reduces parasitic capacitances using a sacrificial cap to provide access to portions of gate sidewall spacers, and removing portions of the sidewall spacers to form channels adjacent to gate structures. A combination gate cap spacer can be formed in the channels and cavities to provide a lower-k material between the gate stack and other conductive elements.

Embodiments of the present invention provide an ultra-low-k spacer with an air gap between gate stacks or structures and conductive contacts, such as an adjacent source/drain contact by replacing a portion of the gate sidewall spacers with lower-k materials.

Exemplary applications/uses to which the present invention can be applied include, but are not limited to: high speed logic circuits (e.g., NAND gates, NOR gates, XOR gates, etc.), low leakage logic circuits, and high speed and/or low leakage memory circuits (e.g., DRAM, SRAM).

It is to be understood that aspects of the present invention will be described in terms of a given illustrative architecture; however, other architectures, structures, substrate materials and process features and steps can be varied within the scope of aspects of the present invention.

Figure 1:
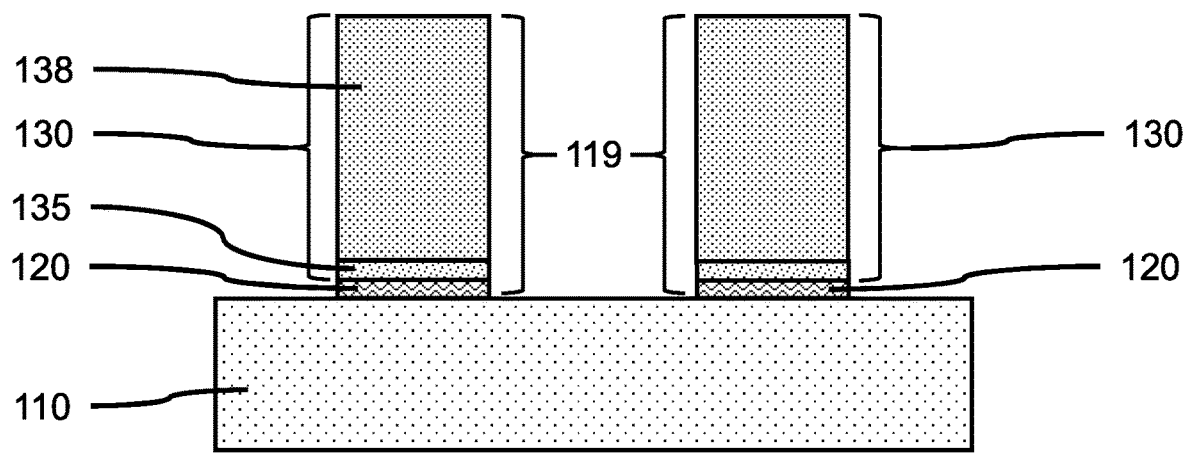
FIG. 1 is a cross-sectional side view showing a plurality of gate stacks for metal-oxide-semiconductor field effect transistor (MOSFET) type devices, each gate stack including, a gate dielectric layer and a gate electrode, in accordance with an embodiment of the present invention.

Referring now to the drawings in which like numerals represent the same or similar elements and initially to FIG. 1, a cross-sectional side view of a plurality of gate stacks for metal-oxide-semiconductor field effect transistor (MOSFET) type devices, each gate stack including, a gate dielectric layer and a gate electrode, is shown, in accordance with an embodiment of the present invention.

In one or more embodiments, one or more gate stacks 119 can be formed on a substrate 110, where each gate stack 119 can include a gate dielectric layer 120 and a conductive gate electrode 130 to form an active gate stack (i.e., capable of functioning as a gate for the device), or a dummy gate dielectric layer and/or dummy gate fill to form a dummy gate stack. The one or more gate stacks 119 can be formed by forming a gate dielectric layer on the substrate 110 and one or more gate electrode layer(s) on the gate dielectric layer, and patterning the layers using lithographic processes and etching. In various embodiments, the gate stack can be a dummy gate stack that can be replaced by an active gate stack later in the process. In various embodiments, the initial gate stack can be an active gate stack including a conductive gate electrode layer.

In one or more embodiments, the gate dielectric layer 120 can be a dielectric material, including, but not limited to, silicon oxide (SiO), silicon nitride (SiN), a high-k (e.g., having a dielectric constant greater than about 7) dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 120 can have a thickness in a range of about 1 nanometer (nm) to about 5 nm, or about 2 nm to about 4 nm, although other thicknesses are also contemplated.

In one or more embodiments, the gate electrode 130 can be a conductive material, including, but not limited to, doped polycrystalline or amorphous silicon (pc-Si, a-Si), germanium (Ge), silicon-germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), tantalum magnesium carbide (TaMgC), carbon nanotubes (CNT), conductive carbon, graphene, or any suitable combination of these materials. The conductive gate electrode material may further include dopants that are incorporated during or after deposition. In some embodiments, the gate electrode 130 can include a work function material layer 135 between the gate dielectric layer 120 and a gate conductor 138. The work function material layer can be a work function metal (WFM). The WFM can be any suitable material, including but not limited a metal nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a metal carbide, including but not limited to titanium carbide (TiC) titanium aluminum carbide (TiAlC), tantalum carbide (TaC), hafnium carbide (HfC), and combinations thereof. In various embodiments, a conductive material or a combination of multiple conductive materials can serve as both the gate conductor 138 and the work function material layer 135 of the gate electrode 130. The gate conductor 138 and work function material layer 135 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In various embodiments, the substrate 110 can be a semiconductor substrate, where the semiconductor can be a type IV semiconductor (e.g., silicon (Si), germanium (Ge)), a IV-IV semiconductor (e.g., silicon-germanium (SiGe), silicon carbide (SiC), a III-V compound semiconductor (e.g., gallium arsenide (GaAs), indium phosphide (InP), indium-gallium arsenide (InGaAs), etc.), where the crystal structure can allow epitaxial growth on a crystalline surface. In various embodiments, the substrate 110 can be a semiconductor-on-insulator substrate (SeOI).

Figure 2:
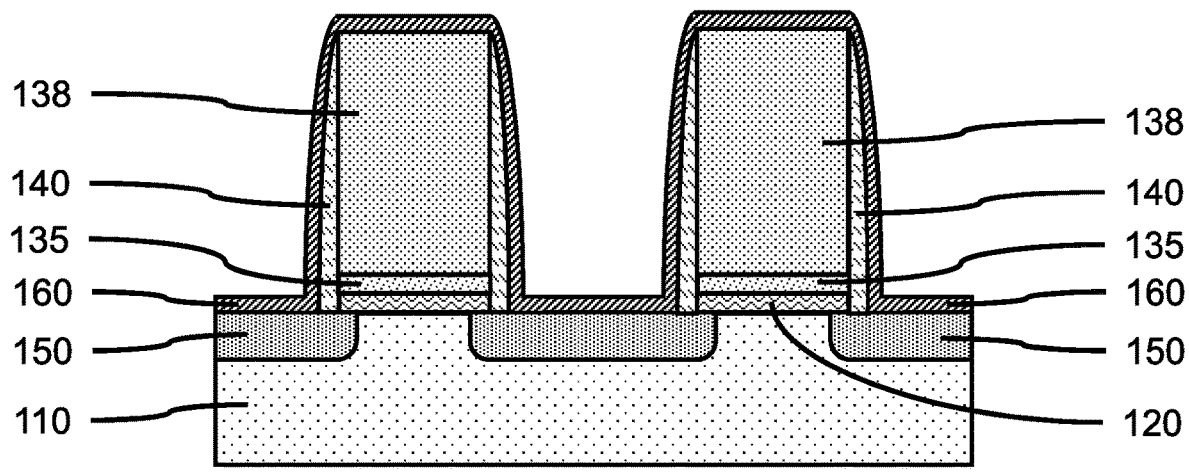
FIG. 2 is a cross-sectional side view showing a plurality of source/drains in the substrate, sidewall spacers on each of the gate stacks, and a protective liner on the sidewall spacers and substrate, in accordance with an embodiment of the present invention.

FIG. 2 is a cross-sectional side view showing a plurality of source/drains in the substrate, sidewall spacers on each of the gate stacks, and a protective liner on the sidewall spacers and substrate, in accordance with an embodiment of the present invention.

In one or more embodiments, a spacer layer can be formed on the gate stack 119, where the spacer layer can be formed by a conformal deposition, for example, atomic layer deposition (ALD), plasma enhanced ALD (PEALD), chemical vapor deposition (CVD), and combinations thereof. The spacer layer can cover exposed surfaces of the substrate 110, gate dielectric layer 120, gate conductor 138 and work function material layer 135 forming the gate electrode 130. Portions of the spacer layer can be removed using a selective, directional etch, for example, a reactive ion etch (RIE) to leave sidewall spacers 140 on the gate electrode 130 and gate dielectric layer 120.

In various embodiments, the sidewall spacers 140 can be a dielectric material, including, but not limited to, silicon nitride (SiN), silicon carbide (SiC), silicon oxynitride (SiON), carbon-doped silicon oxide (SiO:C), silicon-carbon-nitride (SiCN), boron nitride (BN), silicon boron nitride (SiBN), silicon boron carbonitride (SiBCN), silicon oxycarbonitride (SiOCN), silicon oxide (SiO), and combinations thereof. The dielectric material can be a low-k material having a dielectric constant less than about 7, or less than about 5.

In various embodiments, the spacer layer and sidewall spacers 140 can have a thickness in a range of about 3 nm to about 8 nm, or about 3 nm to about 5 nm, although other thicknesses are also contemplated.

In one or more embodiments, source/drains 150 can be formed on the substrate 110, where the source/drains 150 can be formed by in-situ doped epitaxial growth, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques. Dopants can be n-type, for example, phosphorus (P) or arsenic (As), or p-type, for example, boron (B), or gallium (Ga), where the dopants can form an n-type FET or a p-type FET.

In one or more embodiments, a protective liner 160 can be formed on the sidewall spacers 140, substrate 110, and top surfaces of the source/drains 150 and gate conductor 138, where the protective liner 160 can be formed by a conformal deposition (e.g., ALD, PEALD, CVD).

In various embodiments, the protective liner 160 can be a dielectric material, including, but not limited to, silicon nitride (SiN), silicon oxynitride (SiON), and combinations thereof, where the material of the protective liner 160 can be different from the material of the sidewall spacers 140 to provide etch selectivity.

In various embodiments, the protective liner 160 can have a thickness in a range of about 2 nm to about 8 nm, or about 3 nm to about 6 nm, although other thicknesses are also contemplated.

Figure 3:
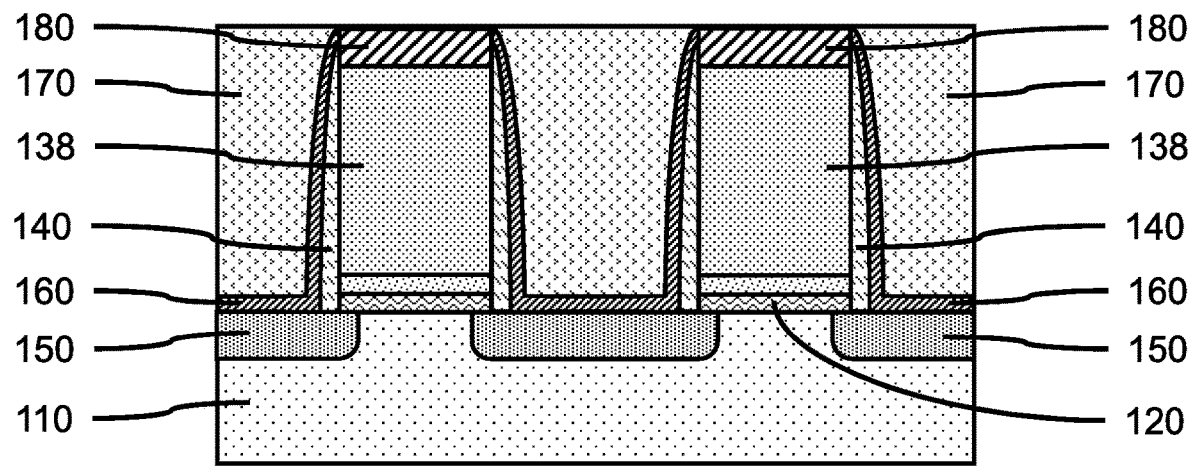
FIG. 3 is a cross-sectional side view showing a first dielectric fill layer formed on the protective liner, and sacrificial gate caps formed on the gate electrode, in accordance with an embodiment of the present invention.

FIG. 3 is a cross-sectional side view showing a first dielectric fill layer formed on the protective liner, and sacrificial gate caps formed on the gate electrode, in accordance with an embodiment of the present invention.

In one or more embodiments, a first dielectric fill layer 170 can be formed on the protective liner 160, where the first dielectric fill layer 170 can be formed by a blanket deposition, for example, chemical vapor deposition (CVD), plasma enhanced CVD (PECVD), spin-on, or combinations thereof. The first dielectric fill layer 170 can fill in the spaces between the protective liner on the gate stacks. A chemical-mechanical polishing (CMP) can be used to remove a portion of the first dielectric fill layer 170 extending above the top surface of the gate electrode 130 and a portion of the protective liner 160 on the top surface of the gate electrode 130.

In various embodiments, the first dielectric fill layer 170 can be a dielectric material, including, but not limited to, silicon oxide (SiO), a low-k dielectric material, and combinations thereof. A low-k dielectric material can include, but not be limited to, carbon doped silicon oxide (SiO:C), fluorine doped silicon oxide (SiO:F), a polymeric material, for example, tetraethyl orthosilicate (TEOS), hydrogen silsesquioxane (HSQ) and methylsilsesquioxane (MSQ), and combinations thereof. The material of the first dielectric fill layer 170 can be different from the protective liner 160 and/or sidewall spacers 140 to provide etch selectivity.

In one or more embodiments, a dummy gate stack can be removed and replaced by an active gate stack (i.e., capable of functioning as a gate for the device) subsequent to forming the protective liner 160 and first dielectric fill layer 170, where a dummy gate dielectric layer and/or dummy gate fill can be removed and the gate dielectric layer 120 and gate electrode 130 including a gate conductor 138 can be formed on the substrate between the sidewall spacers 140.

In one or more embodiments, a portion of the gate conductor 138 can be removed to form a depression between the inward facing sidewalls of the sidewall spacers 140, where the portion of the gate conductor 138 can be removed using a selective isotropic etch (e.g., wet chemical etch or dry plasma etch) or a selective, directional etch (e.g., RIE).

In one or more embodiments, a sacrificial gate cap 180 can be formed in the depression on the gate conductor 138 of the gate electrode 130, where the sacrificial gate cap 180 can be formed by a blanket deposition (e.g., CVD, PECVD), and a CMP can be used to remove excess material and provide a smooth, flat surface.

In various embodiments, the sacrificial gate cap 180 can be a selectively etchable material, including, but not limited to, amorphous silicon (a-Si), amorphous carbon (a-C), silicon-germanium (SiGe), silicon carbide (SiC), a dielectric material different from the first dielectric fill layer 170, protective liner 160, and/or sidewall spacers 140, and combinations thereof, so the sacrificial gate cap 180 can be selectively removed. Because the gate cap 180 is sacrificial, the material choice of the sacrificial gate cap 180 can be greatly broadened by focusing on the etch selectivity between the sacrificial gate cap 180 and the dielectric fill layer 170. The dielectric constant of the sacrificial gate cap can be anything. The thickness of the sacrificial gate cap 180 can be in a range of about 20 nm to about 60 nm.

Figure 4:
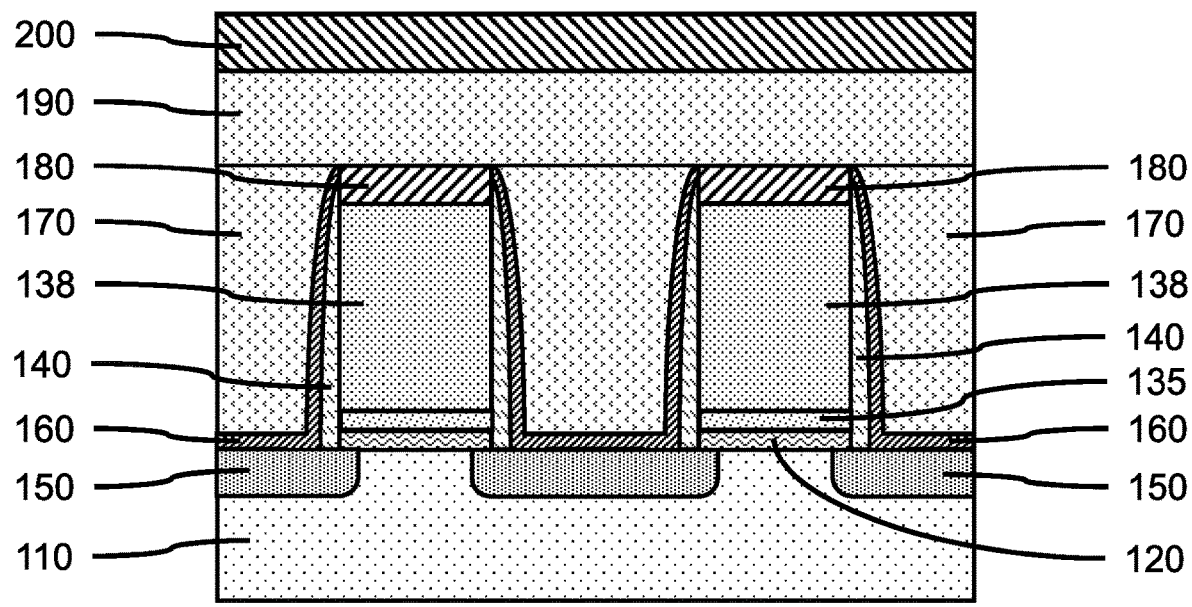
FIG. 4 is a cross-sectional side view showing a second dielectric fill layer on the first dielectric fill layer and sacrificial gate caps, and a masking layer on the second dielectric fill layer, in accordance with an embodiment of the present invention.

FIG. 4 is a cross-sectional side view showing a second dielectric fill layer on the first dielectric fill layer and sacrificial gate caps, and a masking layer on the second dielectric fill layer, in accordance with an embodiment of the present invention.

In one or more embodiments, a second dielectric fill layer 190 can be formed on the first dielectric fill layer 170, sacrificial gate cap(s) 180, and protective liner 160, where the second dielectric fill layer 190 can be formed by a blanket deposition. The second dielectric fill layer 190 can be the same dielectric material as the first dielectric fill layer 170.

In one or more embodiments, a masking layer 200 can be formed on the second dielectric fill layer 190, where the masking layer 200 can be formed by a blanket deposition. The masking layer 200 can be a hardmask dielectric material, including, but not limited to, silicon nitride (SiN), silicon carbonitride (SiCN), silicon boronitride (SiBN), silicon boro carbonitride (SiBCN), and combinations thereof. In various embodiments, the mask layer 200 can be a soft mask material such as a photoresist or organic planarization layer (OPL) or multiple layers of hardmask and soft mask.

Figure 5:
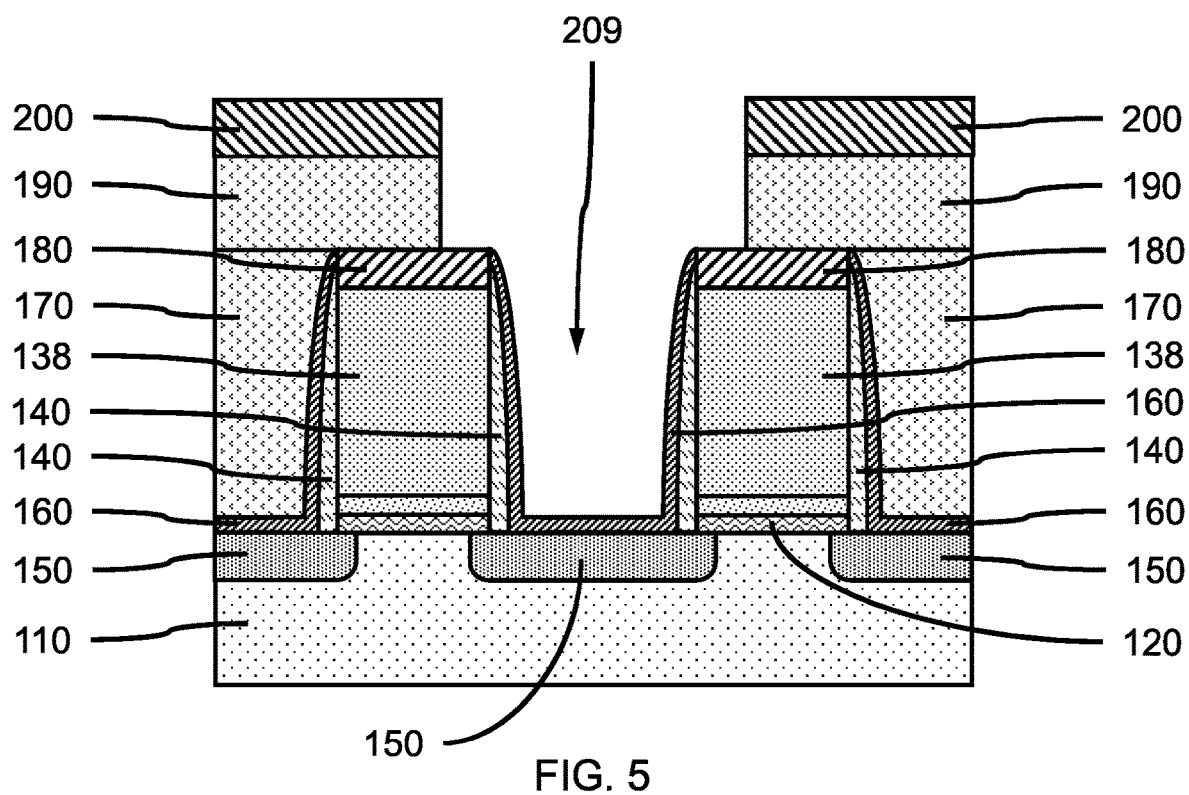
FIG. 5 is a cross-sectional side view showing an opening formed through the masking layer, second dielectric fill layer, and first dielectric fill layer that exposes a portion of the sacrificial gate caps and protective liner, in accordance with an embodiment of the present invention.

FIG. 5 is a cross-sectional side view showing an opening formed through the masking layer, second dielectric fill layer, and first dielectric fill layer that exposes a portion of the sacrificial gate caps and protective liner, in accordance with an embodiment of the present invention.

In one or more embodiments, an opening 209 can be formed through the masking layer 200, second dielectric fill layer 190, and first dielectric fill layer 170, where the opening 209 exposes a portion of the sacrificial gate caps 180 and protective liner 160 on adjacent gate stacks and the substrate 110. The opening 209 can be formed by lithographic processes and a selective, directional etch (e.g., RIE). The opening can be sufficiently wide to expose portions of sacrificial gate caps 180 on adjacent gate stacks. The portion of the protective liner 160 on a source/drain 150 can be exposed by removing the portion of the first dielectric fill layer 170 between the gate stacks.

The etch rate of the sacrificial gate caps 180 can be substantially lower than the etch rate of the first dielectric fill layer 170 and the second dielectric fill layer 190. In some embodiment, the etch rate of the sacrificial gate caps 180 is less than 10% of the etch rate for the etch chemistry of the first dielectric fill layer 170 and the second dielectric fill layer 190. Because the gate cap 180 is sacrificial, the material choice of the sacrificial gate cap 180 can be greatly broadened by focusing on the etch selectivity between the sacrificial gate cap and the dielectric fill layer 170.

Figure 6:
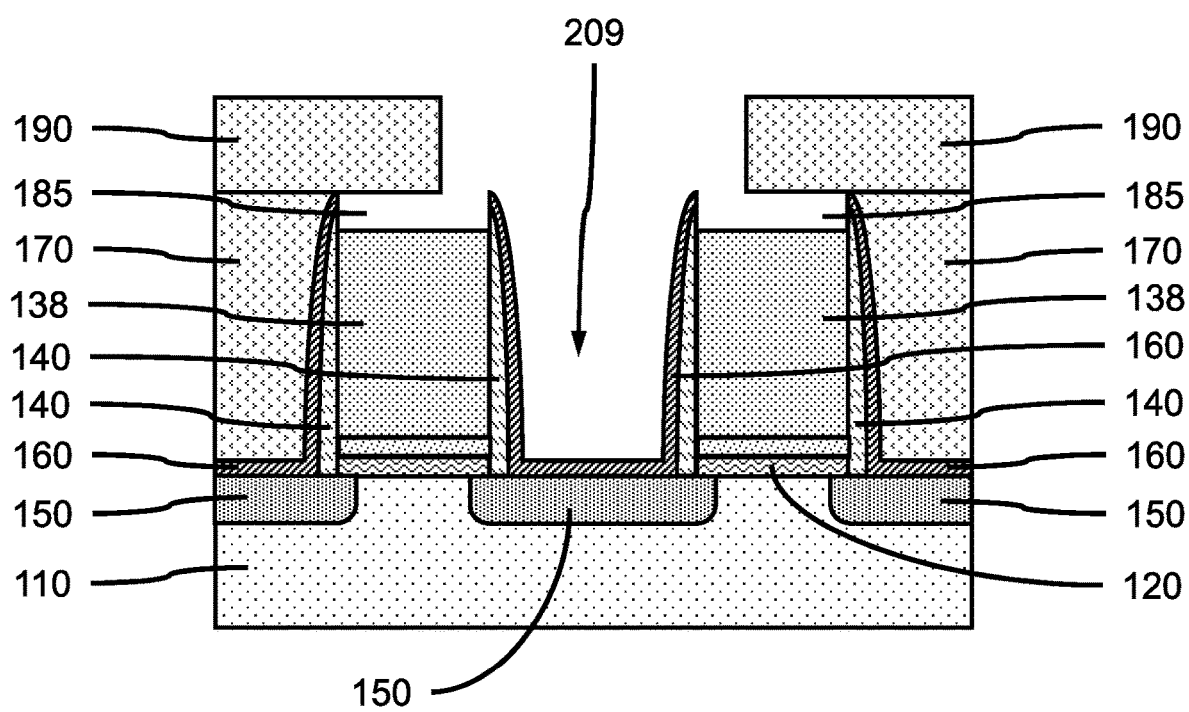
FIG. 6 is a cross-sectional side view showing removal of the sacrificial gate caps that exposes the gate electrode and portions of the sidewall spacers, in accordance with an embodiment of the present invention.

FIG. 6 is a cross-sectional side view showing removal of the sacrificial gate caps that exposes the gate electrode and portions of the sidewall spacers, in accordance with an embodiment of the present invention.

In one or more embodiments, the sacrificial gate caps 180 can be removed using a selective isotropic etch (e.g., wet chemical etch, dry plasma etch) to form a cavity 185 between the top surfaces of the gate conductors 138 of the gate electrodes 130 and the bottom surface of the second dielectric fill layer 190. The cavity 185 can expose a portion of the protective liner 160 and sidewall spacers 140. In various embodiments, the etch rate of the etch chemistry for the removal of the sacrificial gate caps 180 is substantially greater than the etch rate of the first dielectric fill layer 170 and the second dielectric fill layer 190, so the sacrificial gate caps 180 can be removed without damaging the dielectric fill layers 170, 190. In various embodiment, the etch rate of the first dielectric fill layer 170 and the second dielectric fill layer 190 is less than 10% of the etch rate of the sacrificial gate caps 180. Because the gate cap 180 is sacrificial, the material choice of the sacrificial gate cap 180 can be greatly broadened by focusing on the etch selectivity between the sacrificial gate cap and the dielectric fill layer 170. In one or more embodiments, the sacrificial gate cap 180 is amorphous silicon (a-Si), which can be removed by using an aqueous solution containing ammonia, or a plasma etch containing sulfur hexafluoride ($SF_6$). The protective liner can protect the source/drain region(s) 150 during the sacrificial gate cap removal process.

Figure 7:
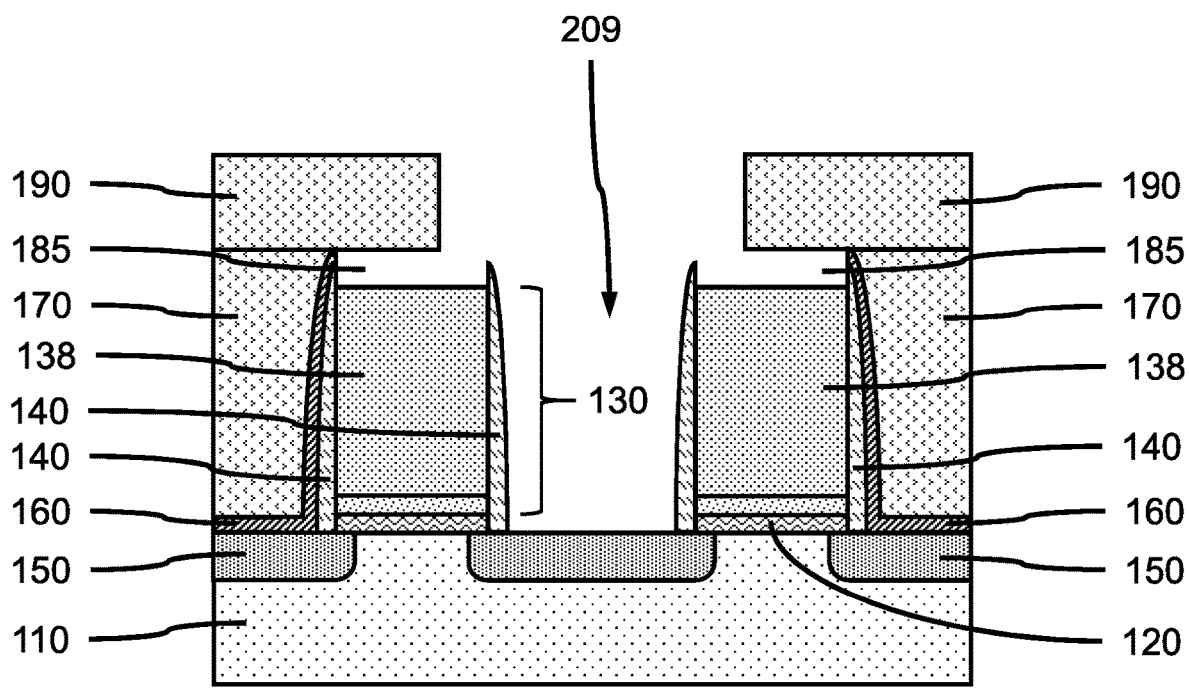
FIG. 7 is a cross-sectional side view showing removal of the protective liner exposed by the opening, in accordance with an embodiment of the present invention.

FIG. 7 is a cross-sectional side view showing removal of the protective liner exposed by the opening, in accordance with an embodiment of the present invention.

In one or more embodiments, the portion of the protective liner 160 expose by removing the portion of the first dielectric fill layer 170 to form the opening 209, can be removed using a selective, isotropic etch. Removal of the portion of the protective liner 160 can expose the underlying sidewall spacers 140 and top surface of source/drain 150.

Figure 8:
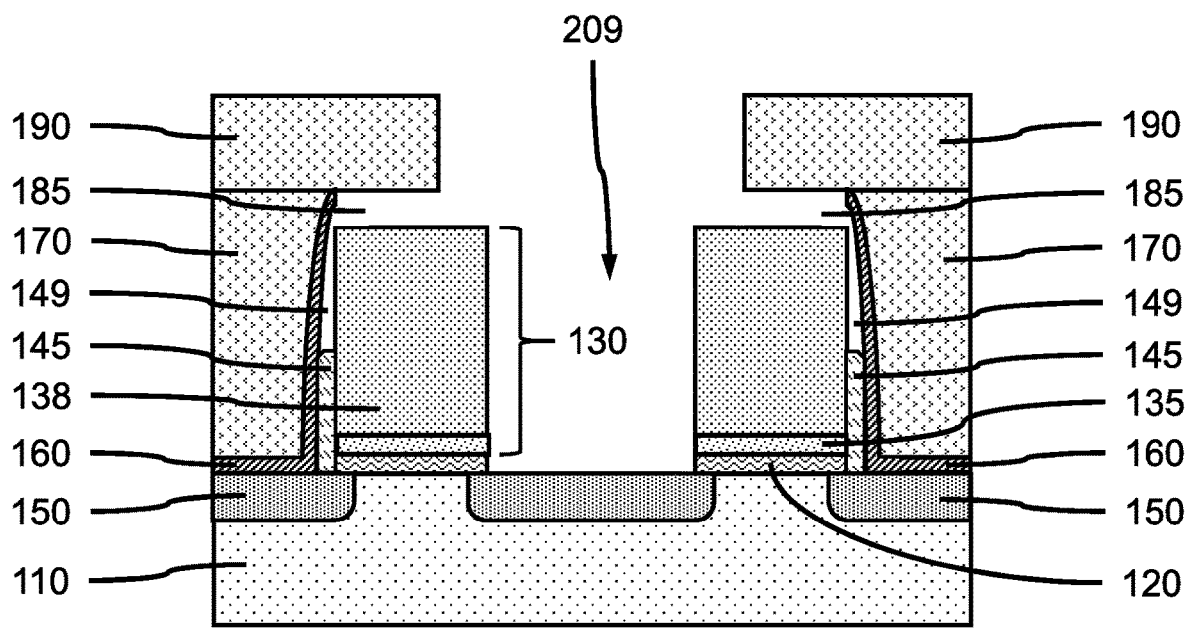
FIG. 8 is a cross-sectional side view showing removal of the sidewall spacers exposed by removal of the protective liner and a portion of the sidewall spacers between the gate electrode and opposite protective liner, in accordance with an embodiment of the present invention.

FIG. 8 is a cross-sectional side view showing removal of the sidewall spacers exposed by removal of the protective liner and a portion of the sidewall spacers between the gate electrode and opposite protective liner, in accordance with an embodiment of the present invention.

In one or more embodiments, the sidewall spacers 140 exposed by removal of the protective liner 160 and a portion of the sidewall spacers 140 between the gate electrode 130 and opposite portion of protective liner 160 exposed by cavity 185 can be removed using a selective isotropic etch. The isotropic etch can remove an upper portion of the sidewall spacers 140 between the gate electrode 130 and opposite portion of protective liner 160 leaving a lower sidewall spacer segment 145. Removal of the upper portion of the sidewall spacers 140 can form a channel 149 next to the gate stack that exposes a portion of the protective liner 160 and gate conductor 138, where the work function material layer 135 can remain covered.

Figure 9:
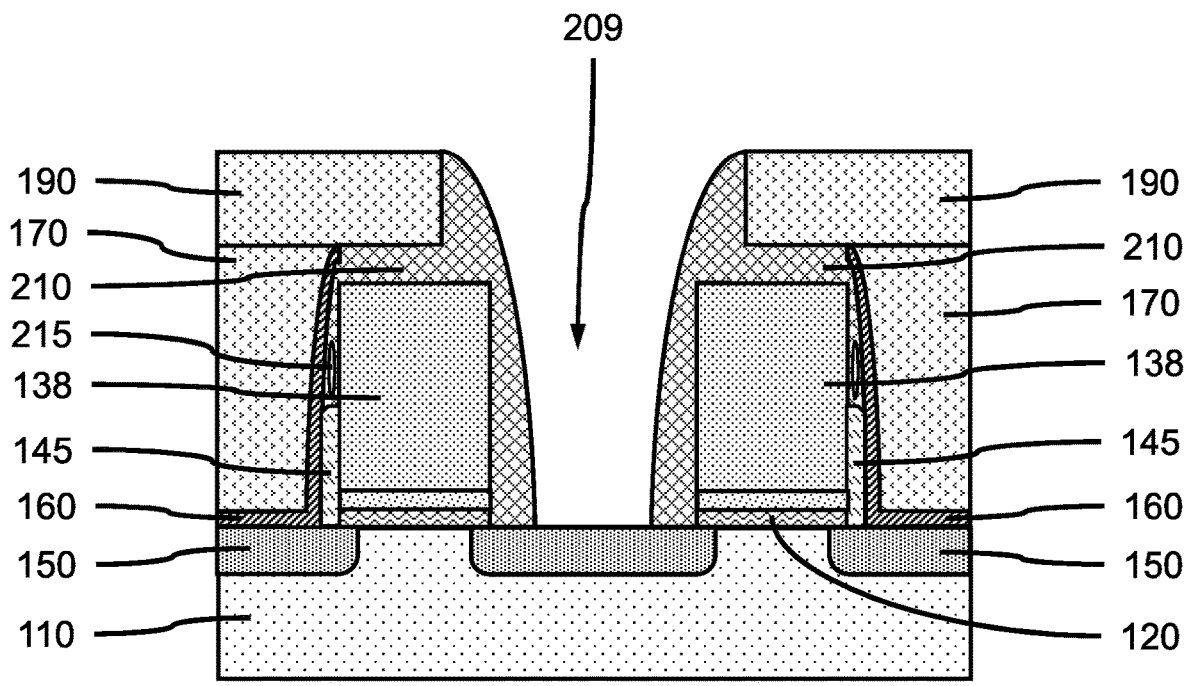
FIG. 9 is a cross-sectional side view showing formation of a combination gate cap spacer with an air gap on the gate electrode, in accordance with an embodiment of the present invention.

FIG. 9 is a cross-sectional side view showing formation of a combination gate cap spacer with an air gap on the gate electrode, in accordance with an embodiment of the present invention.

In one or more embodiments, a combination gate cap spacer 210 with an air gap 215 can be formed on the exposed surfaces of the gate stack 119 and on portions of source/drain 150 and second dielectric fill layer 190. In various embodiments, the combination gate cap spacer 210 can be formed by a conformal deposition, for example, ALD, PEALD, or a combination thereof, where the combination gate cap spacer 210 can fill in cavity 185 and at least a portion of the channel 149 formed by removing the upper portion of the sidewall spacers 140 between the gate electrode 130 and opposite portion of protective liner 160. In various embodiments, an air gap 215 can be formed in the channel 149 next to the gate electrode 130 due to pinch-off of the channel 149, where the width of the sidewall spacers 140 can determine the width of the channel available for deposition precursors to form the combination gate cap spacer 210. A portion of the source/drain 150 can be covered by the combination gate cap spacer 210. The combination gate cap spacer 210 with an air gap 215 can be formed by a deposition (e.g., CVD) followed by a selective etch (e.g., RIE).

In various embodiments, the combination gate cap spacer 210 can be an ultra-low-k dielectric material having a relative dielectric constant of less than 3.9, for example, silicon oxycarbide (SiOC), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), methyl doped silica (SiO:(CH3)), organosilicate glass (SiCOH), porous SiCOH, and combinations thereof. In various embodiments, the combination gate cap spacer 210 can be an ultra-low-k dielectric material having a relative dielectric constant in a range of about 1.8 to about 3.3.

In various embodiments, the combination gate cap spacer 210 can have a thickness of the sidewall of the gate electrode 130 in a range of about 3 nm to about 10 nm, or about 5 nm to about 8 nm, although other thicknesses are also contemplated.

In one or more embodiments, after forming the combination gate cap spacer 210, an opening between adjacent gate stacks that exposes the underlying source/drain 150 can be formed, for example, using RIE. In various embodiments, the opening can be wider at top and narrower at bottom (complementary to the spacer 210 profile). The wider top and narrow bottom opening can be advantageous, as it is easier to completely fill such an opening. The wider top of the opening can also allow more conductive material fill and thus reduces the resistivity of a source/drain contact formed in the remaining width of opening 209.

Figure 10:
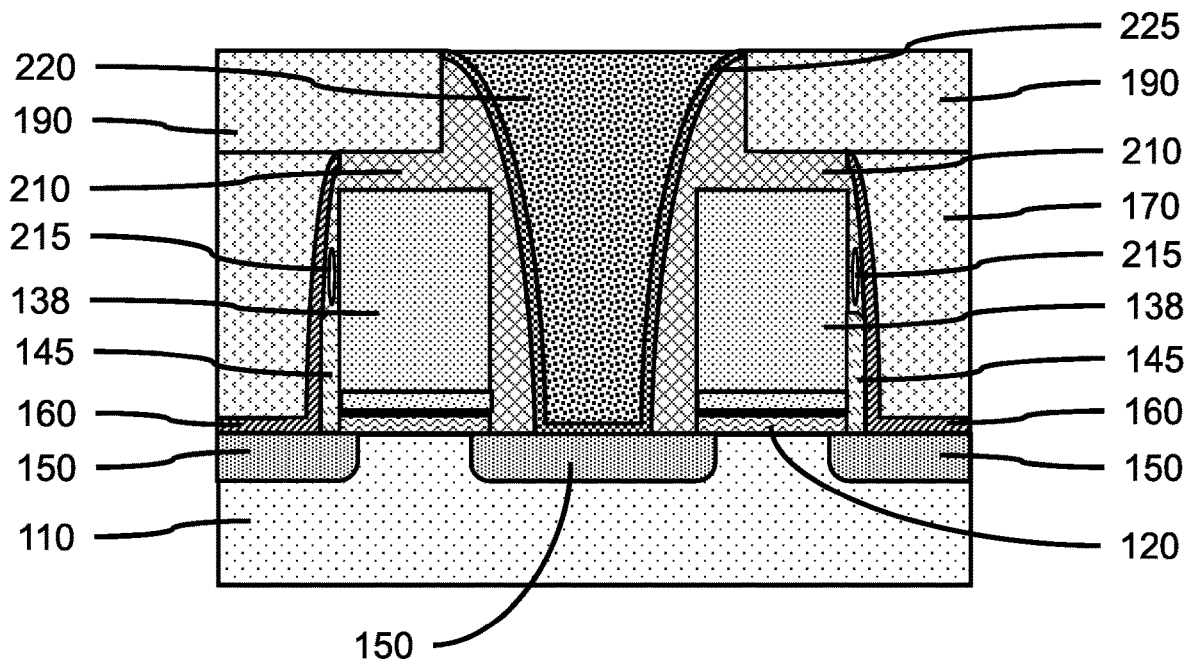
FIG. 10 is a cross-sectional side view showing formation of a source/drain contact between facing combination gate cap spacers, in accordance with an embodiment of the present invention.

FIG. 10 is a cross-sectional side view showing formation of a source/drain contact between facing combination gate cap spacers, in accordance with an embodiment of the present invention.

In one or more embodiments, a source/drain contact 220 can be formed in the space of the opening 209 not filled in by the combination gate cap spacer 210. In various embodiments, the source/drain contact 220 can be a conductive material, including, but not limited to, tungsten (W), aluminum (Al), copper (Cu), cobalt (Co), nickel (Ni), titanium (Ti), ruthenium (Ru), molybdenum (Mo), combinations thereof, or any other suitable conductive material. The source/drain contact 220 can further include a barrier layer 225. The barrier layer 225 can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal component of the source/drain contact 220 with the top region of the source/drain 150 material, the combination gate cap spacer 210, and/or anode/cathode material. In various embodiments, the barrier layer 225 can be deposited in the opening(s) 209 by ALD, CVD, metal-organic CVD (MOCVD), PECVD, or combinations thereof. In various embodiments, the source/drain contact 220 can be formed by ALD, CVD, and/or PVD to form the electrical contacts to the source/drain 150.

In various embodiments, the ultra low-k combination gate cap spacer 210 reduces the parasitic capacitance between the gate electrode 130 and the source/drain contact 220. The reduction of parasitic capacitance can improve the speed of the device and reduce the power consumption at the same time. Because the combination gate cap spacer 210 is formed later in the process of the device fabrication, ultra low-k dielectric materials can be used without the concern of damaging and/or changing material property during the high temperature process occurring in the early stages of device fabrication. In various embodiments, the combination gate cap spacer 210 may be formed between alternating adjacent gate stacks, so intervening adjacent pairs of gate stacks can be skipped to maintain structural rigidity and integrity.

Figure 11:
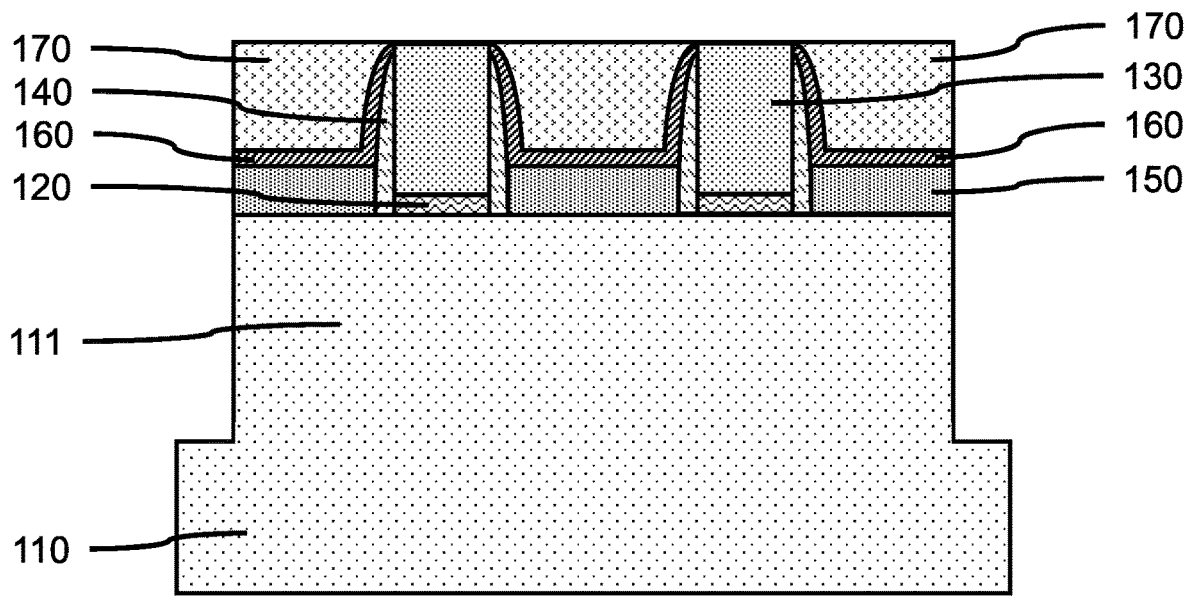
FIG. 11 is a cross-sectional side view showing a plurality of gate structures on a fin field effect transistor (FinFET)

FIG. 11 is a cross-sectional side view showing a plurality of gate structures on a fin field effect transistor (FinFET) device, each gate structure including, a gate dielectric layer and a gate electrode, in accordance with an embodiment of the present invention.

In one or more embodiments, one or more gate structures can be formed on a vertical fin 111 on a substrate 110. The gate structures can include a gate dielectric layer 120 and a gate electrode 130. A sidewall spacer 140 can be on the sidewalls of the gate structure, and a protective liner can be formed on the sidewall spacers 140 and source/drains 150 formed on the vertical fin. A protective liner 160 can be formed on the sidewall spacers 140 and source/drains 150. A first dielectric fill layer 170 can be formed on the protective liner 160.

FIG. 12 is a cross-sectional side view showing a plurality of source/drains on a vertical fin, a sidewall spacer on each of the gate structures, and a sacrificial gate cap on the gate electrode, in accordance with an embodiment of the present invention.

In one or more embodiments, a portion of the gate electrode 130 can be removed and a sacrificial gate cap 180 can be formed in the depression on the gate electrode 130.

FIG. 13 is a cross-sectional side view showing a first dielectric fill layer on the protective liner, a second dielectric fill layer on the first dielectric fill layer and sacrificial gate caps, and a masking layer on the second dielectric fill layer, in accordance with an embodiment of the present invention.

In one or more embodiments, a second dielectric fill layer 190 can be formed on the first dielectric fill layer 170 and sacrificial gate caps 180, and a masking layer 200 can be formed on the second dielectric fill layer 190.

FIG. 14 is a cross-sectional side view showing an opening formed through the masking layer and second dielectric fill layer, that exposes a portion of the sacrificial gate caps and first dielectric fill layer, in accordance with an embodiment of the present invention.

In one or more embodiments, an opening 209 can be formed through the masking layer 200 and second dielectric fill layer 190, that exposes a portion of the sacrificial gate caps 180 on adjacent gate structures and a portion of the first dielectric fill layer 170.

FIG. 15 is a cross-sectional side view showing removal of the exposed portion of the first dielectric fill layer to expose a portion of the protective liner, in accordance with an embodiment of the present invention.

In one or more embodiments, a portion of the first dielectric fill layer 170 exposed by opening 209 can be removed to expose a portion of the protective liner 160 on source/drain 150.

FIG. 16 is a cross-sectional side view showing removal of the sacrificial gate caps that exposes the gate electrode and portions of the sidewall spacers, in accordance with an embodiment of the present invention.

In one or more embodiments, the sacrificial gate caps 180 can be removed to form cavities 185 that expose the gate electrodes 130 and portions of the sidewall spacers 140.

FIG. 17 is a cross-sectional side view showing removal of the protective liner exposed by removing the portion of the first dielectric fill layer, in accordance with an embodiment of the present invention.

In one or more embodiments, a portion of the protective liner 160 exposed by removing the portion of the first dielectric fill layer 170 can be removed to expose the sidewall spacers 140 and source/drain 150.

FIG. 18 is a cross-sectional side view showing removal of the sidewall spacers exposed by removal of the protective liner and a portion of the sidewall spacers between the gate electrode and opposite protective liner, in accordance with an embodiment of the present invention.

In one or more embodiments, the sidewall spacers 140 exposed by removal of the protective liner 160 and a portion of the sidewall spacers 140 between the gate electrode 130 and opposite protective liner 160 can be removed to form a channel 149 next to the gate structure.

FIG. 19 is a cross-sectional side view showing formation of a combination gate cap spacer with an air gap on the gate electrode, in accordance with an embodiment of the present invention.

In one or more embodiments, a combination gate cap spacer 210 with an air gap 215 can be formed in the cavities 185, channels 149, and on the gate electrode 130 and source/drain 150.

FIG. 20 is a cross-sectional side view showing formation of a source/drain contact between facing combination gate cap spacers, in accordance with an embodiment of the present invention.

In one or more embodiments, a source/drain contact 220 can be formed to source/drain 150 between facing sidewalls of the combination gate cap spacers 210.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such h as "beneath," "below," "lower," "above," "upper." and the like, can be used herein for ease of description to describe one element's or feature's relationship to another element(s) or feature(s) as illustrated in the FIGS. It will be understood that the spatially relative terms are intended to encompass different orientations of the device operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a field effect transistor device, comprising:
    forming a gate stack on a substrate;
    forming a sidewall spacer on the gate stack;
    forming a protective liner on the sidewall spacer, wherein the protective liner is a different material from the sidewall spacer;
    forming a sacrificial gate cap on the gate stack;
    forming a first dielectric fill layer on the protective liner;
    forming a second dielectric fill layer on the first dielectric fill layer;
    forming an opening in the second dielectric fill layer and the first dielectric fill layer that exposes a portion of the protective liner and sacrificial gate cap;
    removing the sacrificial gate cap to form a cavity between the gate stack and the second dielectric fill layer; and
    removing the exposed portion of the protective liner to expose a portion of the sidewall spacer.

2. The method of claim 1, further comprising removing a portion of the sidewall spacer to form a channel next to the gate stack.

3. The method of claim 2, further comprising forming a combination gate cap spacer in the channel, cavity, and on at least a portion of the gate stack.

4. The method of claim 3, further comprising forming a source/drain contact in the space of the opening not filled in by the combination gate cap spacer.

5. The method of claim 4, wherein the combination gate cap spacer is an ultra-low-k dielectric material having a dielectric constant less than 3.9.

6. The method of claim 5, wherein the sacrificial gate cap is a material selected from the group consisting of amorphous silicon (a-Si), amorphous carbon (a-C), silicon-germanium (SiGe), and combinations thereof.

7. The method of claim 6, wherein the sidewall spacer is a dielectric material selected from the group consisting of silicon carbonitride (SiCN), silicon boronitride (SiBN), silicon boro carbonitride (SiBCN), and combinations thereof.

8. The method of claim 7, wherein the combination gate cap spacer is formed by a conformal deposition.

9. The method of claim 7, wherein the combination gate cap spacer is an ultra-low-k dielectric material selected from the group consisting of silicon oxycarbide (SiOC), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), methyl doped silica (SiO:(CH3)), organosilicate glass (SiCOH), porous SiCOH, and combinations thereof.

10. The method of claim 7, wherein the protective liner is silicon nitride (SiN).

* * * * *